United States Patent
García González et al.

(10) Patent No.: US 11,711,093 B2
(45) Date of Patent: Jul. 25, 2023

(54) ANALOG-TO-DIGITAL CONVERTER SYSTEM, ELECTRONIC DEVICE AND ANALOG-TO-DIGITAL CONVERSION METHOD

(71) Applicant: ams International AG, Jona (CH)

(72) Inventors: José Manuel García González, Jona (CH); Thomas Froehlich, Jona (CH)

(73) Assignee: AMS INTERNATIONAL AG, Jona (CH)

( * ) Notice: Subject to any disclaimer, the term of this patent is extended or adjusted under 35 U.S.C. 154(b) by 145 days.

(21) Appl. No.: 17/432,270

(22) PCT Filed: Jan. 30, 2020

(86) PCT No.: PCT/EP2020/052299
§ 371 (c)(1),
(2) Date: Aug. 19, 2021

(87) PCT Pub. No.: WO2020/173656
PCT Pub. Date: Sep. 3, 2020

(65) Prior Publication Data
US 2023/0138427 A1    May 4, 2023

(30) Foreign Application Priority Data
Feb. 25, 2019   (EP) ...................... 19159150

(51) Int. Cl.
*H03M 1/14*   (2006.01)
*H03M 1/10*   (2006.01)
(52) U.S. Cl.
CPC ........... *H03M 1/14* (2013.01); *H03M 1/1019* (2013.01)
(58) Field of Classification Search
CPC .............................. H03M 1/14; H03M 1/1019
See application file for complete search history.

(56) References Cited

U.S. PATENT DOCUMENTS

| | | | |
|---|---|---|---|
| 6,313,775 B1 * | 11/2001 | Lindfors | H03M 3/424 341/172 |
| 2003/0076253 A1 * | 4/2003 | Roovers | H03M 1/168 341/156 |

(Continued)

FOREIGN PATENT DOCUMENTS

| | | |
|---|---|---|
| EP | 2930849 A1 | 10/2015 |
| EP | 3104530 A1 | 12/2016 |

OTHER PUBLICATIONS

European Extended Search Report in corresponding EP Application No. 19159150.2 dated Aug. 29, 2019, 16 pages.

(Continued)

*Primary Examiner* — Lam T Mai
(74) *Attorney, Agent, or Firm* — MH2 Technology Law Group LLP (57) ABSTRACT

An ADC system comprises a coarse ADC for determining a coarse word representing an input signal, and an incremental ADC for determining a fine word based on a combination of the input signal and a feedback signal. A first combiner generates a first intermediate output word by joining the coarse word and the fine word. A feedback path generates the feedback signal based on the first intermediate output word. A decimation filter generates a second intermediate output word by filtering the first intermediate output word. A correction block determines a correction word based on the coarse word, on the first and the second predetermined number of bits and conversion parameters of the incremental ADC. A second combiner generates an output word by addition of the second intermediate output word and the correction word.

19 Claims, 2 Drawing Sheets

(56) References Cited

U.S. PATENT DOCUMENTS

2016/0065231 A1\* 3/2016 Gonen .................... H03M 1/42
  341/156
2018/0229831 A1\* 8/2018 Melton ................ B64C 13/503

OTHER PUBLICATIONS

International Search Report in corresponding International Application No. PCT/EP2020/052299 dated Mar. 31, 2020, 16 pages.
Markus et al., "Theory and Applications of Incremental ΔΣ Converters", IEEE Transactions on Circuits and Systems—I: Regular Papers, Apr. 2004, vol. 51 and No. 4, pp. 678-690.
Chae et al., "A 6.3 μW 20 bit Incremental Zoom-ADC with 6 ppm INL and 1 μV Offset", IEEE Journal of Solid-State Circuits, Dec. 2013, vol. 48, No. 12, pp. 3019-3027.
Gönen et al., "A Dynamic Zoom ADC With 109-dB DR for Audio Applications", IEEE Journal of Solid-State Circuits, Jun. 2017, vol. 52, No. 6, pp. 1542-1550.
Liu et al., "A high-resolution low-power and multi-bit incremental converter with smart-DEM", Analog Integrated Circuits and Signal Processing, Mar. 2015, vol. 82, No. 3, 663-674.
Márkus et al., "Incremental Delta-Sigma Structures for DC Measurement: an Overview", IEEE 2006 Custom Intergrated Circuits Conference (CICC), 2006, pp. 41-48.
Vogelmann et al., "Improved SQNR and MSA in Incremental ΔΣ Modulators by Using a Recuperation Phase", IEEE Transactions on Circuits and Systems—II: Express Briefs, May 2018, vol. 65, No. 5, pp. 557-561.

\* cited by examiner

ANALOG-TO-DIGITAL CONVERTER SYSTEM, ELECTRONIC DEVICE AND ANALOG-TO-DIGITAL CONVERSION METHOD

CROSS-REFERENCE TO RELATED APPLICATIONS

The present application is the national stage entry of International Patent Application No. PCT/EP2020/052299, filed on Jan. 30, 2020, and published as WO 2020/173656 A1 on Sep. 3, 2020, which claims the benefit of priority of European Patent Application No. 19159150.2, filed on Feb. 25, 2019, all of which are incorporated by reference herein in their entirety.

FIELD OF THE INVENTION

The present disclosure relates to an analog-to-digital converter, ADC, system, to an electronic device with such an ADC system and to an analog-to-digital conversion method.

BACKGROUND OF THE INVENTION

Analog-to-digital conversion is widely used for converting various analog signals, e.g. provided by sensors, to respective digital values. In many applications a high accuracy for the conversion is desired.

Examples of known ADCs are successive approximation, SAR, ADCs or ADCs based on sigma-delta modulation. In recent times incremental ADCS, which make use of sigma-delta modulation, have been investigated. These can be combined with other ADCs such that the other ADC performs a coarse conversion of an input signal, while the incremental ADC performs a fine conversion of the remaining signal. However, the accuracy of such combinations has deficiencies, in particular if the input signal is in signal regions resulting in variations in the coarse conversion.

An objective to be achieved is to provide an improved conversion concept for analog-to-digital conversion with improved performance and/or reduced effort.

This objective is achieved with the subject matter of the independent claims. Embodiments and developments of the improved concept are defined in the dependent claims.

SUMMARY OF THE INVENTION

The improved conversion concept is based on an ADC structure with a coarse ADC for determining a digital coarse word from an input signal and with an incremental ADC for determining a digital fine word based on a combination of the input signal and a feedback signal such that a resulting output word is based a joint combination of the coarse word and the fine word. The improved conversion concept is based on the insight that numerical errors occur due to the feedback from the joint combination, even if the fine conversion is performed iteratively for a single, preferably constant, input signal, and that there is a dependency of the numerical error on the coarse word. To this end, such a numerical error is approximated according to the improved conversion concept in order to produce a correction word, inter alia based on the coarse word, which correction word can be applied to the joint combination of the coarse word and the fine word or some intermediate word derived thereof. The accuracy in the analog-to-digital conversion can therefore be improved.

According to an example implementation of the improved conversion concept, an ADC system comprises a coarse ADC and an incremental ADC. The coarse ADC is configured to determine a digital coarse word representing an input signal, wherein the coarse word has a first predetermined number of bits. The incremental ADC is configured to determine a digital fine word based on a combination of the input signal and a feedback signal, wherein the fine word has a second predetermined number of bits. A first combiner of the ADC system is configured to generate a digital first intermediate output word by joining the coarse word and the fine word.

For example, the coarse word represents most significant bits, MSB, of the first intermediate output word and the fine word represents least significant bits, LSB, of the first intermediate output word.

The ADC system further comprises a feedback path including a digital-to-analog converter, DAC, for generating the feedback signal based on the first intermediate output word, e.g. corresponding to an analog representation of the first intermediate output word. Hence, the feedback signal is more or less a representation of the input signal and a refining part for the incremental ADC, such that, for example, the combination of the input signal and the feedback signal provided to the incremental ADC results in this refining portion.

The ADC system further comprises a decimation filter configured to generate a digital second intermediate output word by filtering the first intermediate output word. For example, the decimation filter is implemented with an integrator or a cascade of several integrators.

The ADC system further comprises a correction block configured to determine a correction word based on the coarse word, on the first and the second predetermined number of bits and on a variable value that depends on the coarse word and conversion parameters of the incremental ADC. A second combiner of the ADC system is configured to generate an output word by addition of the second intermediate output word and the correction word.

For example, the incremental ADC is configured to determine the digital fine word iteratively with a predefined number of integration cycles. For example, during operation of the ADC system, the coarse ADC in a first operation step determines the digital coarse word from the input signal and after that, the incremental ADC starts to convert the residue of the coarse conversion employing the feedback path. The fine conversion with the incremental ADC is performed iteratively, refining the result with each integration cycle. For example the incremental ADC is operated with a higher clock rate or conversion rate than the coarse ADC. The decimation filter, which also operates in the digital domain, performs its filter operation preferably with the same clock rate as the incremental ADC. Accordingly, the first intermediate output word and the second intermediate output word may change their output value with each integration cycle.

The correction word is, for example, determined after the predefined number of integration cycles for providing the final output word that corresponds to the input signal.

For example, the application of the correction block, respectively the correction word, allows to reduce the number of integration cycles for one output word while achieving the same performance or accuracy. Reducing the number of integration cycles within a given time interval for analog-to-digital conversion results in less power consumption of the ADC system.

As mentioned above, the determination of the correction word is inter alia based on conversion parameters of the incremental ADC. For example, a transfer function of the incremental ADC, including the effects of iterative processing, can be determined for an actual implementation of the incremental ADC. From this transfer function, a numerical residual can be determined analytically which resembles or approximates a conversion error, in particular for a given coarse word. Hence, the correction word can be determined based on such an analytical expression of a conversion error, which is taken in account with the combination with the second intermediate output word.

Accordingly, various implementations of the incremental ADC are possible. For example, in a basic implementation, the incremental ADC comprises a single integration stage, which includes a stage input and a feedforward output being coupled via an integrator and a weighting element, and a quantizer coupled to the feedforward output. The integration stage is configured to receive the combination of the input signal and the feedback signal at the stage input. The quantizer is configured to determine the fine word based on an output signal at the feedforward output. Accordingly, a simple and efficient structure can be implemented this way. The quantizer may be a multi-bit or multi-level quantizer.

In another example implementation the incremental ADC comprises a cascade of at least two integration stages, a summation element and a quantizer. Similar to the single stage implementation, each of the integration stages comprises a respective stage input and a respective stage output being coupled via a respective integrator of that stage, and a respective feedforward output coupled to an output of the respective integrator of that stage via a respective weighting element.

A first integration stage of the cascade is configured to receive the combination of the input signal and the feedback signal at its stage input. A second integration stage and, if present, any further integration stages of the cascade have their respective stage inputs coupled to the stage outputs of a respective preceding integration stage of the cascade. Hence, each integration stage, except the first stage, has a predecessor, and each integration stage, except a last stage of the cascade, has a successor. The feedforward outputs of the integration stages are coupled to respective inputs of the summation element. For example, the number of inputs of the summation element corresponds to the number of integration stages. The quantizer is configured to determine the fine word based on an output signal of the summation element. For example, the accuracy of the conversion can be improved with the higher number of integration stages.

The incremental ADC may be implemented with a switched-capacitor circuit or with a continuous time circuit approach.

For example, in the implementations with a single integration stage or with multiple integration stages, each weighting element is configured to apply a respective feedforward weight, and each integrator is configured to apply a respective integrator weight. If, for example, the feedforward output is directly coupled to the output of the associated integrator, this corresponds to a feedforward weight of 1. The same applies to the feedforward weight(s).

For example, the conversion parameters that are used in the correction block include the integrator weights and the feedforward weight that is associated with a last integration stage of the cascade, or with the single integration stage, respectively. Hence, the signal path from the input of the first or single integration stage to the quantizer is taken into account.

In some implementations, the variable value used in the correction block is a function of a range factor, which depends on the coarse word, and a product of the conversion parameters. For instance, each possible combination of the coarse word, the number of which depends on the first predetermined number of bits, corresponds to respective individual ranges of the input signal to be converted. For example, the range factor is different for each of these ranges.

For example, the correction block is configured to retrieve the range factor from a storage block, for instance a lookup table, based on a coarse word. Hence, the various range factors may be determined in advance during a calibration phase of the ADC system for each of the possible coarse ranges.

As an alternative, the variable value, including the range factor and the product of conversion parameters may be stored in the storage block.

For example, the storage block comprises, for each possible bit combination of the coarse word, a respective value that has been determined by measuring a conversion error at transition levels of neighboring bit combinations of the coarse word. For example, bit combinations are neighboring if they result from a change in the least significant bit of the coarse word. Hence, the higher accuracy can be achieved by a calibration measurement, for example after production of the ADC system.

In the integration stages described, or also in other implementations of the incremental ADC, sigma-delta structures can be used. Hence, for example, the conversion parameters may be parameters or weights of the sigma-delta modulation.

In various implementations, the correction block is configured to determine the correction word calve according to $$calw = coarse \cdot \frac{n_{FINE}}{n_{TOTAL}} \cdot \frac{MK}{a_{LAST} \cdot \prod_{i=1}^{LAST} c_i},$$

with coarse being a representation of the coarse word, $n_{FINE}$ representing a number of quantization levels of the fine word, e.g. resulting from the second predetermined number of bits, $n_{TOTAL}$ representing a number of quantization levels of the first intermediate output word, e.g. resulting from the sum of the first and second predetermined number of bits, MK being the range factor, which depends on the coarse word, $a_{LAST}$ being the feedforward weight being associated with a last integration stage of the cascade or with the single integration stage, respectively, $c_i$ representing the integrator weights and LAST being the number of integration stages of the incremental ADC.

In various implementations of the ADC system, the feedback path includes a matching block that is configured to apply a dynamic element matching algorithm, in particular a data weighted averaging algorithm.

In various implementations, the ADC system can be completely implemented as an integrated circuit, i.e. including the correction block. In other implementations, all components except the correction block and, optionally, the second combiner are implemented as an integrated circuit and the correction block and, optionally, the second combiner are provided external to that integrated circuit. In the latter implementation, besides the second intermediate output word, also the coarse word and the fine word, in particular after a last integration cycle, have to be provided to the external correction block and the second combiner, respectively. The external correction block and combiner may be implemented in hardware or in software running on a processor or the like.

According to another aspect of the improved conversion concept, an electronic device may comprise at least one sensor and an ADC system according to one of the embodiments described above, wherein the ADC system is configured to perform an analog-to-digital conversion of a signal provided by the at least one sensor, i.e. the sensor signal is the input signal of the ADC system.

For example, the at least one sensor is implemented as a temperature sensor, a capacitive sensor like MEMS based pressure, humidity or gas sensor, without excluding other implementations, an X-ray imaging sensor or an image sensor for computed tomography, to name only a few.

Another aspect of the improved conversion concept relates to an analog-to-digital conversion method. For example, in one embodiment such a method comprises determining, with a coarse analog-to-digital converter, a digital coarse word representing an input signal, the coarse word having a first predetermined number of bits. The method further comprises determining, with an incremental ADC, a digital fine word based on a combination of the input signal and a feedback signal, the fine word having a second predetermined number of bits. A digital first intermediate output word is generated by joining the coarse word and the fine word.

The feedback signal is generated based on the first intermediate output word including a digital-to-analog conversion. A digital second intermediate output word is generated by filtering the first intermediate output word with a decimation filter. A correction word is determined based on the coarse word, on the first and the second predetermined number of bits and on a variable value that depends on the coarse word and conversion parameters of the incremental ADC. An output word is generated by addition of the second intermediate output word and the correction word.

For example, the digital fine word is determined iteratively with a predefined number of integration cycles.

Further embodiments of the method become apparent for the skilled reader from the various embodiments described above for the ADC system according to the improved conversion concept.

The improved conversion concept will be described in more detail below for several embodiments with reference to the drawings. Identical reference numerals designate signals, elements or components with identical functions. If signals, elements or components correspond to one another in function, a description of them will not necessarily be repeated in each of the following figures.

DETAILED DESCRIPTION

Figure 1:
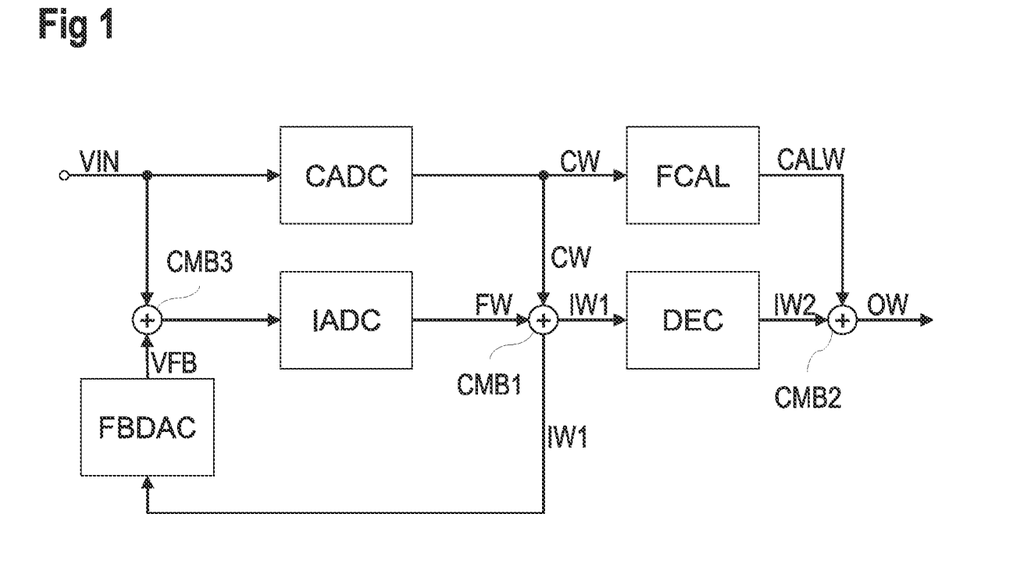
FIG. 1 shows an example implementation of an ADC system according to the improved conversion concept.

FIG. 1 shows an example implementation of an analog-to-digital converter, ADC, system comprising a coarse ADC CADC and an incremental ADC IADC. The coarse ADC CADC is coupled to an input of the ADC system for receiving an input signal VIN. At an output, the coarse ADC CADC provides a coarse word CW based on the input signal VIN, the coarse word CW having a first predetermined number of bits. The incremental ADC IADC provides a fine word FW at its output based on a signal provided at its input, the fine word FW having a second predetermined number of bits. A first combiner CMB1 receives the coarse word CW and the fine word FW for generating a digital first intermediate output word IW1 by joining the coarse word CW and the fine word FW. In particular, the coarse word CW represents the most significant bits, MSB, of the first intermediate output word and the fine word FW represents the least significant bits, LSB, of the first intermediate output word IW1.

The first intermediate output word IW1 is provided to a decimation filter DEC that is configured to generate a digital second intermediate output word IW2 by filtering the first intermediate output word IW1. The second intermediate output word IW2 is provided to a second combiner CMB2. The first combiner CMB1 further provides the first intermediate output word IW1 to a feedback path that includes a digital-to-analog converter, DAC, FBDAC, which provides an analog feedback signal VFB, e.g. corresponding to an analog representation of the first intermediate output word IW1, to a third combiner CMB3.

The third combiner CMB3 combines the feedback signal VFB with the input signal VIN to generate the signal at the input of the incremental ADC IADC.

During operation of the ADC system, the incremental ADC IADC may perform the respective conversion iteratively, e.g. with a predefined number of integration cycles.

The second intermediate output word IW2 basically corresponds to a digital representation of the input VIN, but may be affected with conversion errors. However, the ADC system further comprises a correction block FCAL that receives the coarse word CW at its input for generating a correction word CALW that is provided to the second combiner CMB2. The second combiner CMB2 is configured to generate an output word OW by addition of the second intermediate output word IW2 and the correction word CALW.

The combination of the coarse ADC, CADC, which may be implemented as a successive approximation ADC, for example, and the incremental ADC, IADC, form a zoom incremental ADC. For example, the incremental ADC, IADC, together with the feedback path forms a sigma-delta loop. It has been found that the performance of such sigma-delta loops can be increased by increasing the number of clock cycles or integration cycles for the incremental operation. If a specific overall conversion rate of the ADC system is desired, this means that the sigma-delta loop and the decimation filter have to be operated at higher clock frequencies that increase the power consumption of the ADC system.

According to the improved conversion concept, a higher performance of the sigma-delta loop and the overall system can also be achieved by the correction block FCAL, which generates the correction word CALW based on the coarse word CW, on the first and the second predetermined number of bits and on a variable value that depends on the coarse word CW and conversion parameters of the incremental ADC. For example, these conversion parameters depend on the parameters of the sigma-delta modulation in the sigma-delta loop. For example, a residual error resulting from the sigma-delta loop can be determined analytically based on the aforementioned parameters in order to determine a correction word CALW in each case. This has the effect that only a lower number of integration cycles has to be performed with the incremental ADC IADC and the decimation filter DEC and a higher residual error at this stage is compensated for with the correction word CALW. Therefore the power consumption can be reduced due to the lower number of integration cycles.

Figure 2:
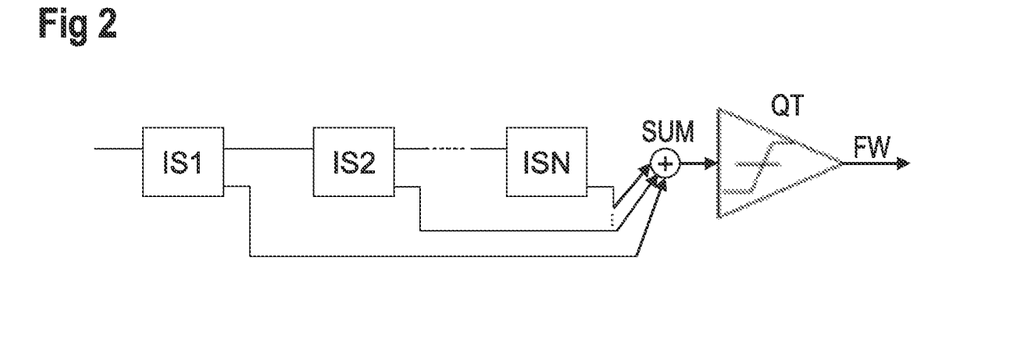
FIG. 2 shows an example implementation of an incremental ADC.

FIG. 2 shows an example implementation of the incremental ADC IADC. In this example, the incremental ADC IADC comprises a plurality of integration stages IS1, IS2, . . . , ISN, which are arranged in a cascade.

Figure 3:
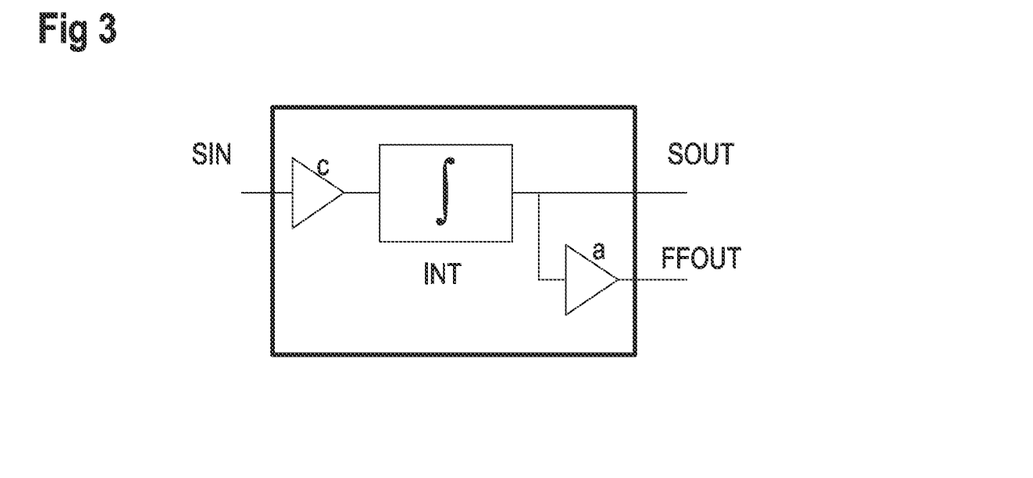
FIG. 3 shows an example implementation of an integration stage of the incremental ADC.

Referring now to FIG. 3, an example implementation of one of such integration stages of FIG. 2 is shown. For example, the integration stage comprises a respective stage input SIN and a respective stage output SOUT coupled via a respective integrator INT. The integrator INT operates with an integrator weight c, for example. The integration stage further comprises a feedforward output FFOUT that is coupled to the output of the integrator INT with a feedforward weight a applied.

The integration stages are, for example, implemented as switched-capacitor circuits or continuous time circuits.

Referring back to FIG. 2, it can be seen that the first integration stage of the cascade, namely the integration stage IS1, corresponds to the overall input of the incremental ADC. In other words, the stage input of the first integration stage IS1 receives the combination of the input signal VIN and the feedback signal VFB from the third combiner CMB3.

The stage output of the first integration stage IS1 is coupled to the stage input of the second integration stage IS2 and so on. In other words, the second integration stage IS2 and any further integration stages, symbolically represented with an Nth integration stage ISN have their respective stage input coupled to the stage outputs of a respective preceding integration stage of the cascade. The feedforward outputs of all integration stages IS1, IS2, . . . , ISN are coupled to respective inputs of a summation element SUM, the output of which is provided to a quantizer QT. For example, the quantizer QT is a multi-bit quantizer. The quantizer QT provides the fine word FW and its output. In some implementations of the incremental ADC IADC, only a single integration stage is comprised. Referring to the example of FIG. 2, this means that all integration stages IS2 to ISN are simply omitted, and also the summation element is obsolete in such a configuration. Details of such an implementation of an incremental ADC should become readily apparent to the skilled reader from the explanations above.

Referring back to FIG. 1, the whole ADC system or only parts of it can be implemented as an integrated circuit. Hence, in one implementation all components are integrated into a common integrated circuit. In other implementations, the correction block FCAL and, optionally, the second combiner CMB2 are provided externally, while the remaining components are integrated together. In the latter implementation the correction block FCAL may be provided externally as a separate integrated circuit or a field-programmable gate array, FPGA, as a hardware implementation or as a software module running on some kind of external processor.

If the correction block FCAL is provided externally, the remaining circuit of the ADC system provides the coarse word CW and, optionally, the fine word FW to the correction block FCAL. The correction block FCAL has knowledge of the first and the second predetermined number of bits. Depending on the implementation, the external implementation may have direct access to the second intermediate output word IW2 as well.

Figure 4:
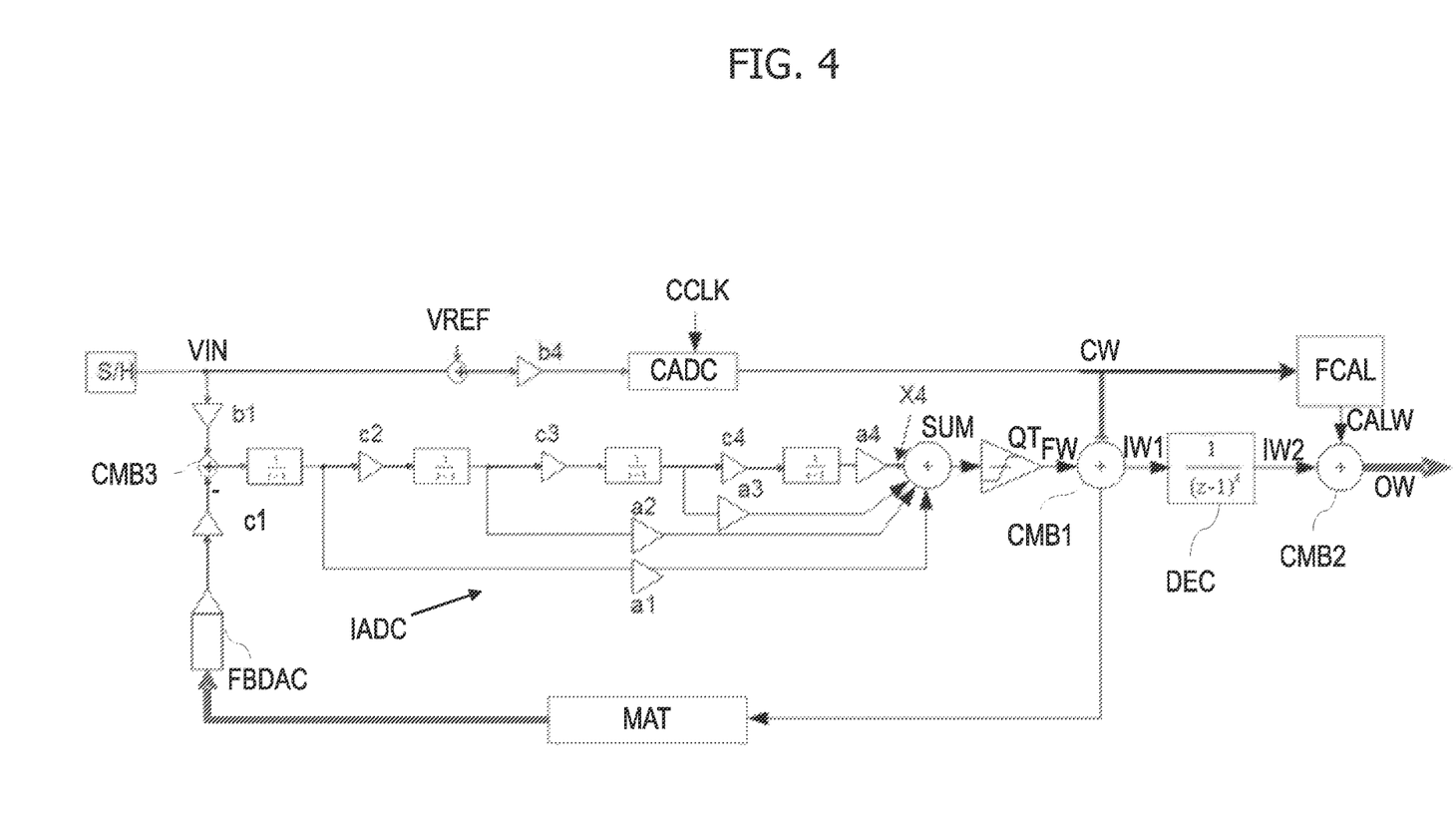
FIG. 4 shows a further example implementation of an ADC system according to the improved conversion concept.

Referring now to FIG. 4, a further implementation example of an ADC system is shown that is based on the example embodiment of FIG. 1. Accordingly, it is only referred to implementation details that have not be discussed before in conjunction with the examples of FIG. 1, FIG. 2 and FIG. 3.

For example, the input signal VIN may be provided by a sample-and-hold element S/H that keeps the input signal basically constant over the overall integration time. Based on the example of FIG. 2, the incremental ADC IADC is implemented with a cascade of four integration stages with each integration stage being associated with a respective integrator weight $c_1$, $c_2$, $c_3$, $c_4$ and a respective associated feedforward weight $a_1$, $a_2$, $a_3$, $a_4$ for providing the forwarded signals to the summation element SUM. Each integrator is represented by a functional block $(1/z-1)$.

The decimation filter DEC is composed by a cascade of four integrators in this example, represented by the functional block $(1/z-1)^4$.

In the coarse conversion path, a reference voltage VREF is provided as an ADC reference voltage. Furthermore, the input signal of the coarse ADC CADC is weighted by a factor $b_4$. The coarse ADC CADC is operated with a coarse clock CCLK that is lower, in particular significantly lower, than a clock frequency of the incremental ADC and the decimation filter DEC. For instance, the coarse ADC CADC is implemented as a successive approximation, SAR, ADC.

In this example, the feedback path further comprises a matching block MAT that is configured to apply a dynamic element matching, DEM, algorithm, for example a data weighted averaging, DWA, algorithm. This matching block MAT improves the performance of the sigma-delta loop. In this example implementation, two further weighting elements are implemented, a first one with weighting factor $b_1$ for weighting the input signal VIN at the input of the third combiner CMB3, and a second element with weighting factor $c_1$ for weighting the digital-to-analog converted feedback signal at the second input of the third combiner CMB3. A stability of the overall system, in particular of the sigma-delta loop may depend on the ratio between the two weighting factors $b_1$, $c_1$.

It should be apparent to the skilled reader that the weighting element with factor $c_1$ could also be placed directly in front of the first integrator, corresponding to a respective integrator weight. In this case, the value of $b_1$ might be adapted accordingly.

The arrangement of FIG. 4 can be considered as a feed forward incremental ADC in which the forward path is the coarse ADC CADC. The coarse ADC CADC determines the coarse word CW with the first predetermined number of bits at the start of a conversion by converting the analog input signal VIN into a digital signal with a reduced number of levels. After the end of the coarse conversion, the incremental ADC IADC starts to convert the residual of the coarse conversion using the sigma-delta loop. The sigma-delta loop only has an impact on the least significant bits, LSB, of the intermediate output word IW1, that is, only to the fine word FW having the second predetermined number of bits. A bit stream of the zoom incremental ADC, formed by the joint combination of the coarse word CW and the fine word FW, is decimated by a decimation filter DEC. The residual of the conversion after an Nth integration cycle can be calculated at point X4, that is after the last integration stage, according to:

$$Vres_{X4}(N) = b1 \cdot c2 \cdot c3 \cdot c4 \cdot a4 \sum_{i=1}^{N} \sum_{j=1}^{i-1} \sum_{m=1}^{j-1} \sum_{k=1}^{m-1} Vin - \quad (1)$$

$$c1 \cdot c2 \cdot c3 \cdot c4 \cdot a4 \sum_{i=1}^{N} \sum_{j=1}^{i-1} \sum_{m=1}^{j-1} \sum_{k=1}^{m-1} \frac{d_k \cdot V_{ref}}{n_{TOTAL}},$$

wherein $n_{TOTAL}$ represents a number of quantization levels of the first intermediate output word, i.e. the total number of quantization levels, e.g. resulting from the sum of the first and second predetermined number of bits, Vref is the ADC reference voltage VREF, $c_i$ represent the integrator weights and $$d_k = b4 \cdot \frac{Vin}{V_{ref}} \cdot \text{coarse} + n_{FINE} \cdot fine_k \quad (2)$$

with coarse being a representation of the coarse word and $n_{FINE}$ being the number of quantization levels of the fine word, resulting from the second predetermined number of bits, and $fine_k$ represents the output of the fine quantizer at each conversion/integration cycle k of the incremental ADC IADC, e.g. bit-stream.

Thus:

$$Vres_{X4}(N) = \sum_{i=1}^{N} \sum_{j=1}^{i-1} \sum_{m=1}^{j-1} \sum_{k=1}^{m-1} Vin \cdot c2 \cdot c3 \cdot c4 \cdot a4 \cdot \left(b1 - c1 \cdot b4 \cdot \frac{\text{coarse}}{n_{TOTAL}}\right) - \quad (3)$$

$$c1 \cdot c2 \cdot c3 \cdot c4 \cdot a4 \cdot \sum_{i=1}^{N} \sum_{j=1}^{i-1} \sum_{m=1}^{j-1} \sum_{k=1}^{m-1} \frac{n_{FINE} \cdot fine_k v_{ref}}{n_{TOTAL}}$$

The first term of the above equation represents the input of the incremental conversion, whereas the second term represents the quantization error of such conversion due to a limited number of conversion cycles.

From equation (3), in particular the second term, a general function for determining the correction word calw can be derived, resulting in $$calw = \text{coarse} \cdot \frac{n_{FINE}}{n_{TOTAL}} \cdot \frac{MK}{a_{LAST} \cdot \prod_{i=1}^{LAST} c_i}, \quad (4)$$

with MK being a range factor, which depends on the coarse word, $a_{LAST}$ being the feedforward weight being associated with a last integration stage of the cascade or with the single integration stage, respectively, $c_i$ representing the integrator weights and LAST being the number of integration stages of the incremental ADC.

The range factor MK depends on the coarse word CW but ideally has a value of 1. The purpose of the range factor MK is to compensate potential errors caused by variations of the integrator weights during circuit fabrication. For example, values of MK can be determined by measuring the conversion error at coarse conversion transition levels of neighboring bit combinations of the coarse word CW.

In various implementations, the range factor MK may be retrieved from a storage block like a lookup table. The storage block can be implemented both with non-volatile memories or volatile memories, whatever is more suitable for the application.

It should be noted that the specific implementation of FIG. 4 with exactly four integration stages and a fourth order decimation filter is not considered limiting as other numbers of integration stages and/or filter orders can be applied as well to implement the improved conversion concept.

For example, an electronic device may comprise at least one sensor and an ADC system according to one of the embodiments described above, wherein the ADC system is configured to perform an analog-to-digital conversion of a signal provided by the at least one sensor, i.e. the sensor signal is the input signal of the ADC system.

For example, the at least one sensor is implemented as a temperature sensor, a capacitive sensor like MEMS based pressure, humidity or gas sensor, without excluding other implementations, an X-ray imaging sensor or an image sensor for computed tomography, to name only a few.

The invention claimed is:

1. An analog-to-digital converter, ADC, system comprising
a coarse ADC configured to determine a digital coarse word representing an input signal, the coarse word having a first predetermined number of bits;
an incremental ADC configured to determine a digital fine word based on a combination of the input signal and a feedback signal, the fine word having a second predetermined number of bits;
a first combiner configured to generate a digital first intermediate output word by joining the coarse word and the fine word;
a feedback path including a digital-to-analog converter, DAC, for generating the feedback signal based on the first intermediate output word;
a decimation filter configured to generate a digital second intermediate output word by filtering the first intermediate output word;
a correction block configured to determine a correction word based on the coarse word, on the first and the second predetermined number of bits and on a variable value that depends on the coarse word and conversion parameters of the incremental ADC; and
a second combiner configured to generate an output word by addition of the second intermediate output word and the correction word.

2. The ADC system according to claim 1, wherein the incremental ADC configured to determine the digital fine word iteratively with a predefined number of integration cycles.

3. The ADC system according to claim 1, wherein
the incremental ADC comprises a cascade of at least two integration stages, a summation element and a quantizer;
each of the integration stages comprises a respective stage input and a respective stage output being coupled via a respective integrator of that stage, and a respective feedforward output coupled to an output of the respective integrator of that stage via a respective weighting element;
a first integration stage of the cascade is configured to receive the combination of the input signal and the feedback signal at its stage input;
a second integration stage and, if present, any further integration stages of the cascade have their respective stage inputs coupled to the stage outputs of a respective preceding integration stage of the cascade;

the feedforward outputs are coupled to respective inputs of the summation element; and the quantizer is configured to determine the fine word based on an output signal of the summation element.

4. The ADC system according to claim 1, wherein the incremental ADC comprises a single integration stage, which includes a stage input and a feedforward output being coupled via an integrator and a weighting element, and a quantizer coupled to the feedforward output;

the integration stage is configured to receive the combination of the input signal and the feedback signal at the stage input; and the quantizer is configured to determine the fine word based on an output signal at the feedforward output.

5. The ADC system according to claim 3, wherein each weighting element is configured to apply a respective feedforward weight; and each integrator is configured to apply a respective integrator weight.

6. The ADC system according to claim 5, wherein the conversion parameters include the integrator weights and the feedforward weight being associated with a last integration stage of the cascade or with the single integration stage, respectively.

7. The ADC system according to claim 6, wherein the variable value is a function of a range factor, which depends on the coarse word, and a product of the conversion parameters.

8. The ADC system according to claim 7, wherein the correction block is configured to retrieve the range factor from a storage block, in particular a look-up table, based on the coarse word.

9. The ADC system according to claim 8, wherein the storage block comprises, for each possible bit combination of the coarse word, a respective value that has been determined by measuring a conversion error at transition levels of neighboring bit combinations of the coarse word.

10. The ADC system according to claim 5, wherein the correction block is configured to determine the correction word calw according to $$calw = \text{coarse} \cdot \frac{n_{FINE}}{n_{TOTAL}} \cdot \frac{MK}{a_{LAST} \cdot \prod_{i=1}^{LAST} c_i},$$

with coarse being a representation of the coarse word, $n_{FINE}$ representing a number of quantization levels of the fine word, $n_{TOTAL}$ representing a number of quantization levels of the first intermediate output word, MK being a range factor, which depends on the coarse word, $a_{LAST}$ being the feedforward weight being associated with a last integration stage of the cascade or with the single integration stage, respectively, $c_i$ representing the integrator weights and LAST being the number of integration stages of the incremental ADC.

11. The ADC system according to claim 5, wherein the feedback path includes a matching block that is configured to apply a dynamic element matching algorithm, in particular a data weighted averaging algorithm.

12. An electronic device with at least one sensor and an analog-to-digital converter, ADC, system according to claim 1, wherein the ADC system is configured to perform an analog-to-digital conversion of a signal provided by the at least one sensor.

13. The electronic device according to claim 12, wherein the at least one sensor is implemented with one of the following:
a temperature sensor;
a capacitive sensor;
an X-ray imaging sensor;
an image sensor for computed tomography.

14. An analog-to-digital conversion method comprising:
determining, with a coarse analog-to-digital converter, ADC, a digital coarse word representing an input signal, the coarse word having a first predetermined number of bits;
determining, with an incremental ADC, a digital fine word based on a combination of the input signal and a feedback signal, the fine word having a second predetermined number of bits;
generating a digital first intermediate output word by joining the coarse word and the fine word;
generating the feedback signal based on the first intermediate output word including a digital-to-analog conversion;
generating a digital second intermediate output word by filtering the first intermediate output word with a decimation filter;
determining a correction word based on the coarse word, on the first and the second predetermined number of bits and on a variable value that depends on the coarse word and conversion parameters of the incremental ADC; and
generating an output word by addition of the second intermediate output word and the correction word.

15. The method according to claim 14, wherein the digital fine word is determined iteratively with a predefined number of integration cycles.

16. The method according to claim 14, wherein the incremental ADC comprises one of
a cascade of at least two integration stages, a summation element and a quantizer, wherein each of the integration stages comprises a respective stage input and a respective stage output being coupled via a respective integrator of that stage, and a respective feedforward output coupled to an output of the respective integrator of that stage via a respective weighting element; or
a single integration stage, which includes a stage input and a feedforward output being coupled via an integrator and a weighting element, and a quantizer coupled to the feedforward output;
the method further comprising
applying a respective feedforward weight with each weighting element; and
applying a respective integrator weight with each integrator.

17. The method according to claim 16, wherein
the conversion parameters include the integrator weights and the feedforward weight being associated with a last integration stage of the cascade or with the single integration stage, respectively; and
the variable value is a function of a range factor, which depends on the coarse word, and a product of the conversion parameters.

18. The method according to claim 17, further comprising retrieving the range factor from a storage block, in particular a look-up table, based on the coarse word, wherein the storage block comprises, for each possible bit combination of the coarse word, a respective value that has been determined by measuring a conversion error at transition levels of neighboring bit combinations of the coarse word.

19. The method according to claim 16, wherein the correction word calw is determined according to $$calw = \text{coarse} \cdot \frac{n_{FINE}}{n_{TOTAL}} \cdot \frac{MK}{a_{LAST} \cdot \prod_{i=1}^{LAST} c_i},$$

with coarse being a representation of the coarse word, $n_{FINE}$ representing a number of quantization levels of the fine word, $n_{TOTAL}$ representing a number of quantization levels of the first intermediate output word, MK being a range factor, which depends on the coarse word, $a_{LAST}$ being the feedforward weight being associated with a last integration stage of the cascade or with the single integration stage, respectively, $c_i$ representing the integrator weights and LAST being the number of integration stages of the incremental ADC.

* * * * *